United States Patent [19]

Eccleston et al.

[11] Patent Number: 4,716,398

[45] Date of Patent: Dec. 29, 1987

[54] LINEARITY CONTROL CIRCUIT FOR DIGITAL TO ANALOG CONVERTER

[75] Inventors: Larry E. Eccleston, Edmonds; John C. Emery, Everett, both of Wash.

[73] Assignee: John Fluke Mfg. Co., Inc., Everett, Wash.

[21] Appl. No.: 19,427

[22] Filed: Feb. 26, 1987

[51] Int. Cl.$^4$ ............................................. H03M 1/66
[52] U.S. Cl. .............................. 340/347 DA; 307/571; 307/572
[58] Field of Search ............... 307/262, 491, 571, 572; 323/223, 224, 228; 324/123 C, 123 R; 330/282; 340/347 DA, 347 M Primary Examiner—William M. Shoop, Jr.
Assistant Examiner—Richard K. Blum
Attorney, Agent, or Firm—Israel Gopstein

[57] ABSTRACT

In a circuit utilizing a digital to analog converter, an amplifier receives two voltage levels of a digitally modulated input signal via two different switching circuits. Linearity of output signals provided by the amplifier is significantly improved by a circuit for effectively matching the resistances provided by the two switching circuits to the amplifier. A feedback circuit from the output of the amplifier, including a feedback amplifier, is used to withdraw from a switching device any current passing therethrough when ON, thus eliminating any effect of resistance of the switching device from the amplifier.

16 Claims, 1 Drawing Figure

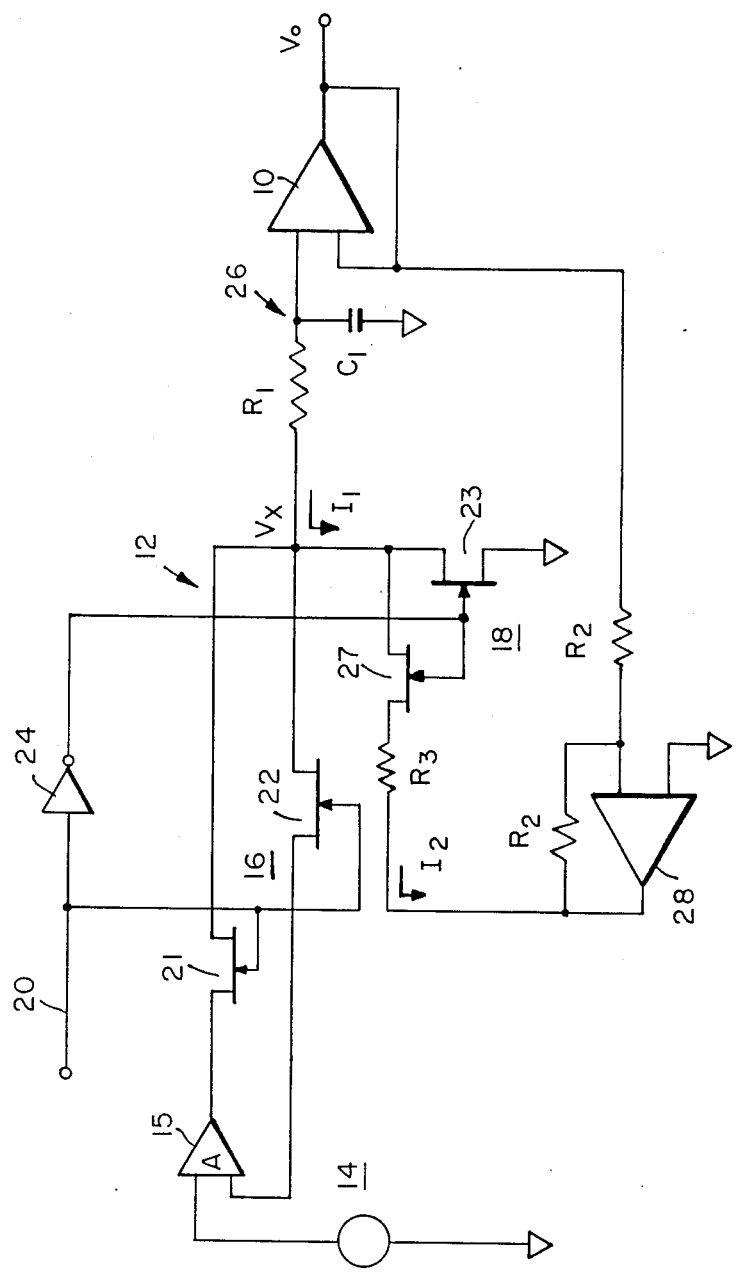

LINEARITY CONTROL CIRCUIT FOR DIGITAL TO ANALOG CONVERTER

TECHNICAL FIELD

This invention relates to digital-to-analog converting devices (DAC), and more specifically to such converting devices used in electrical measurement devices. More particularly, the invention relates to correction of nonlinearity problems occurring in known digital-to-analog-converting devices and caused by impedance mismatches between input voltage sources.

BACKGROUND ART

In prior art electrical measurement devices, it is known to use switched signals having a relatively fixed frequency, in a range which may be anywhere from 15Hz up to 10KHz, having a duty cycle which is modulated. The signal is then filtered, and the end result is an analogue, DC, voltage which is buffered and used at the output of the instrument. A variety of techniques have been used in the prior art to modulate, convert, and filter the pulse-width-modulated signal. The more widely used techniques are known to incur linearity problems, however.

One such technique uses a pulse-width-modulator (PWM), producing a PWM signal which is provided to a non-inverting amplifier after input filtration of the signal. However, the non-inverting amplifier arrangement is known to suffer from problems of nonlinearity.

One method for minimizing nonlinearity is known to be the use of an inverting amplifier in the DAC. However, such circuitry is significantly more complex and requires much more stringent characteristics than required of the non-inverting amplifier.

For example, a second inversion stage is required to obtain the proper polarity for the output signal. Moreover, precision circuitry, with precision amplifiers, is required to invert the signal in measurement apparatus using sensitive null detection and calibration techniques. Such additional circuitry introduces noise into the signals, which thus adversely affects the accuracy of the measurement apparatus.

Still another disadvantage of the use of an inverting amplifier at the input to the DAC is the fact that for circuitry using an inverting amplifier the filtering circuits must be provided in the loop of the circuit, rather than at the input terminal of the amplifier. Such a filtering arrangement, particularly for a multi-pole filter, may lead to serious stability problems, which must be overcome by still further circuit modifications.

Still further, because the filter is required in the feedback loop of the inverting amplifier, the signals provided to the amplifier are high frequency signals. Thus, the amplifier is required to have precise, stable, high frequency characteristics in order to satisfy the loop gain requirements. That is, high-frequency amplifiers are required if an inverting amplifier is used to correct nonlinearity problems.

There is accordingly a need in the prior art to provide compensation for linearity occurring in input circuits providing PWM signals to DAC devices. There is more specifically a need to overcome nonlinearity problems occurring in DAC input circuits without, at the same time, creating additional difficulties in the circuit, and requiring more complex and expensive circuitry.

Another known technique for minimizing nonlinearity, which continues to use a non-inverting amplifier and avoids the difficulties associated with the use of an inverting amplifier, utilizes software control, in which the mismatched resistances of the series and shunt switches are measured. The expected nonlinearity due to such a mismatch is accordingly calculated by the software, and the measured output voltage is corrected for the presumed non-linearity by computational methods.

However, software correction is inherently not performed in real-time, and clearly requires expensive processing of the output signal prior to effective utilization thereof.

There is thus a need in the prior art for real-time linearity correction of signals provided to a DAC from a PWM via a series-shunt circuit, without requiring additional computational steps to be performed in order to estimate and/or correct the nonlinearity.

DISCLOSURE OF INVENTION

It is accordingly a primary object of the present invention to overcome the difficulties of the prior art, and more specifically to provide a linearity correcting arrangement for a DAC circuit receiving a PWM input signal.

It is a more particular object of the invention to provide a linearity correction arrangement which overcomes nonlinearities caused by impedance mismatches between two switch arrangements used to provide two voltage levels to an input amplifier.

Still a further object of the invention is the correction of nonlinearity caused by impedance mismatch of input switches providing two voltage levels to an input amplifier of a DAC without requiring use of an inverting amplifier.

Yet another object of the invention is the provision of a linearity correcting input circuit for switched input voltages provided to a non inverting amplifier wherein a filter is provided between a switching arrangement and the amplifier input.

In accordance with the foregoing objects of the invention, there is provided in the invention a linearity compensating circuit operable for compensating for differences in resistance between at least two switching devices which supply a modulated signal comprised of different voltages to a digital to analog converting apparatus. The DAC has an input amplifier receiving the different voltages through at least the two switching devices. The linearity compensating circuit includes first means for substantially eliminating resistance of one of the switching devices from affecting a first voltage provided therethrough to the input amplifier, and second means for substantially eliminating resistance of another of the switching devices from affecting a second voltage provided therethrough to the input amplifier.

In accordance with the invention, the first means comprises a reference voltage source including a controlled amplifier with a voltage sense line for maintaining a substantially constant voltage provided by the voltage source to an input of the input amplifier. The reference voltage source is sensed across the first switching device thereby to produce an accurate voltage on the other side thereof. This arrangement eliminates any voltage drop that would be caused by the first switching device. Significantly, the second means includes feedback means for feeding back an output voltage of the input amplifier, the feedback means arranged for collecting substantially all current associated with the second voltage provided to the input amplifier. thereby removing current from the other of the switching devices. The arrangement thus eliminates effects of any resistance of the second switching device on the second voltage provided to the input amplifier.

Preferably, the feedback means comprises a feedback amplifier with an input connected to the output of the input amplifier, the feedback amplifier arranged to provide an output voltage equal to a predetermined multiple of the output voltage of the input amplifier. Additionally, the circuit is arranged to set a current withdrawn from the second switching device to equal a current supplied thereto from the input terminal of the input amplifier.

In accordance with another aspect of the invention, there is provided an improvement for a digital to analog converter including an input amplifier receiving a pulse width modulated signal. The signal is comprised of first and second voltages transmitted to an input of the input amplifier in a modulated manner by first and second controlled switching devices. The first and second controlled switching devices are connected to the input of the input amplifier, and the improvement comprises a resistance eliminating means for eliminating resistance of at least one of the switching devices from affecting an output voltage produced by the input amplifier. The resistance eliminating means includes a withdrawing structure for withdrawing from the switching device an amount of current substantially equal to the current provided thereto from the input of the input amplifier. The withdrawing structure includes an amplifier connected between an output of the input amplifier and the switching device. A gain control means is provided for controlling gain of the amplifier thereby to provide an output voltage of the amplifier as a predetermined function of an output voltage of the input amplifier. Additionally, the withdrawing structure includes a current control device for setting an amount of current which is a predetermined function of the output voltage of the amplifier. The current control device is connected to obtain that current from the switching device, so that all current provided to the switching device from the input terminal of the input amplifier is withdrawn by the withdrawing structure. The inventive arrangement thus substantially eliminates any effects of internal resistance of the switching device from affecting output voltage or current of the input amplifier.

Preferably, in the improved digital to analog converter the current control device comprises an impedance selected at a ratio of the output voltage of the amplifier to the current provided to the switching device from the input terminal of the input amplifier.

Moreover, the gain control means includes a resistance network connected to input and output terminals of the amplifier.

In accordance with yet another aspect, the invention provides a digital to analog converter which includes an input amplifier, connected for receiving a digitally modulated signal and for converting the digitally modulated signal to an analog signal representing a value associated therewith, and at least two controlled switching devices for respectively transmitting first and second voltages to an input of the input amplifier in a modulated manner. A first controlled switching device is connected to a first voltage level and the second controlled switching device is connected to a second voltage level.

A correction means is provided to eliminate effects of resistance mismatch between the first and second controlled switching devices from an output voltage produces by the input amplifier. The correction means includes a withdrawing structure for withdrawing from at least one of the switching devices an amount of current substantially equal to the current provided to the at least one switching device from the input of the input amplifier when the switching device is ON. The withdrawing structure, in turn, includes a number of components. An amplifier is connected between an output of the input amplifier and the switching device. A gain control device is provided for controlling gain of the amplifier, thereby to provide the output voltage of the amplifier as a redetermined function of an output voltage of the input amplifier. A current control arrangement is included for setting a current magnitude as a predetermined function of the output voltage of the amplifier. The current control arrangement is connected to obtain the current from the switching device, whereby all current provided to the switching device from the input terminal of the input amplifier is withdrawn by the withdrawing structure. Accordingly, the inventive structure substantially eliminates any effects of internal impedance of the switching device from affecting the output voltage or current of the input amplifier.

In accordance with the invention, the correction means further comprises other means for eliminating impedance effects of the second of the controlled switching devices from affecting the output voltage or current of the input amplifier.

In a practical circuit embodying the invention, the first and second controlled switching devices comprise FET switching transistors driven by a control voltage applied to gate terminals thereof. The switching arrangement includes series and shunt connected switching transistors connected in series and in shunt with the input of the input amplifier.

Advantageously, the input amplifier preferable comprises a non-inverting amplifier.

Moreover, there is provided a filter for the signal, the filter is advantageously connected at the input to the input amplifier.

Other objects, features and advantages of the present invention will become readily apparent to those skilled in the art from the following description wherein there is shown and described a preferred embodiment of the invention, simply by way of illustration and not of limitation of one of the best modes (and alternative embodiments) suited to carry out the invention. As will be realized upon examination of the specification and from practice of the same, the present invention is capable of still other, different, embodiments and its several details are capable of modifications in various obvious aspects, all without departing from the invention. Accordingly, the drawings and the descriptions provided herein are to be regarded as illustrative in nature an not as restrictive of the invention.

BRIEF DESCRIPTION OF THE DRAWING

The sole FIG. is an illustration of a circuit embodying the present invention.

BEST MODE OF CARRYING OUT THE INVENTION

Referring now to the drawing, the solitary drawing figure shows a circuit structure embodying the present invention, in which a precision DC voltage level and ground (or other DC level) are provided to an operational amplifier and a filter circuit for digital-to-analog-conversion and in which nonlinearities are minimized in accordance with the concept of the invention.

As shown in the figure, a PWM signal is provided to an input of a non-inverting amplifier 10. Such a signal is provided by a series-shunt switching arrangement, generally shown at 12, in which a precision DC, or reference, voltage supplied by a source 14 and a sense amplifier 15 is connected to the input via a series switch 16, while ground level is connected to the input via a shunt switch 18. The series switch 16 may be formed of a first switching transistor 22 and a second sense switch transistor 21, essentially in a parallel connection therewith. The switches of the series-shunt combination are enhancement field-effect transistors (MOSFET) which are controlled by a control voltage 20, having the desired duty cycle ratio, output by a pulse width modulator (PWM) (not shown). The series switch 16, including switches 22 and 21, is used, together with shunt switch 18, is used by the reference voltage source 14 and amplifier 15 to provide a sensed voltage $V_x$, shown in the drawing.

The control voltage is provided to the gates of the two transistors 21 and 22 forming the series switch 16, as well as to the gate of a transistor 23 forming the shunt switch 18. Inverter 24 may be provided to supply the control voltage 20 to the gate of transistor 23 if the transistor is of the same type as transistors 21-22. Alternatively, for opposite type transistors, voltage 20 may be provided directly to the gate of transistor 23.

The above described series-shunt switch combination connects either the DC or ground voltage to the amplifier input. However, because of mismatch between the resistances of the series and the shunt switching transistors, the above described combination is found to provide a source of nonlinearity in the circuit.

In operation, variation of the duty cycle of control voltage 20 provides a pulse width modulated waveform $V_x$, whose average value equals the output voltage. The PWM waveform is filtered via a filter 26, illustrated as including a resistor $R_1$ and a capacitor $C_1$ in an integrating, or low pass, filter arrangement. As will be appreciated by those skilled in the art to which the invention pertains, although a simple filter is shown, a five- or six-pole filter is typically utilized to enhance the precision of the results.

The average voltage of the pulse width modulated waveform $V_x$ is to be represented at the output of amplifier 10 by an analog, or DC, voltage shown in the drawing as $V_o$. However, because of circuit resistances, and more particularly because of differences between the ON resistance of transistors 21, 22 on the one hand and transistor 23 on the other, some current flow differences may exist when the two voltage levels are provided to the input terminal of amplifier 10. Thus, the output voltage $V_o$ may be a nonlinear function of $V_x$ and, more particularly, a nonlinear function of the parameter being represented by the duty cycle modulation thereof.

In the present invention, the effects of the resistances of the transistors 21, 22 and 23 are removed as follows.

Sense amplifier 15 is used in the structure of reference source 14 to sense the output voltage $V_x$ and to provide precise changes in the source voltage in order to regulate the portion of the voltage at $V_x$ contributed by the reference source 14. Towards that end, in order to assure that no additional current is drawn from the reference source 14 when transistors 21–22 are ON, a fourth switching FET may be provided, as shown at 27, although a switching action may not be necessary. This transistor, which is also driven by the inverted control voltage supplied to transistor 23, is thus turned OFF when transistors 21–22 are ON, to assure that no current is diverted from the input to amplifier 10 during those portions of the PWM waveform. Thus, the resistance contributions of switch transistors 21 and 22 to the resistance $R_1$ of the filter, which contributions are typically in the range of 0–5 ohms, are effectively totally removed.

More specifically, for typical values of resistance for FETs 21 and 22 the effective resulting resistance is divided by a factor A, where A is the loop gain of the amplifier loop in the reference voltage source 14, including specifically the gain of amplifier 15. Thus, for fairly large loop gains, as above noted, the contribution of FETs 21–22 to the resistance seen by the filter 26 and the amplifier 10 is made negligible and does not affect operation of the circuit, being reduced effectively to zero.

A further point adding to the nonlinearity of operation of the circuit is the resistance of transistor 23. Since the resistance of transistors 21 and 22 has been effectively reduced to zero, the circuitry provided in the present invention effectively reduces the resistance of transistor 23 to zero to match the effective resistance of transistors 21–22.

Towards that end, the inventive structure adds a feedback amplifier 28.

Amplifier 28 is connected to the output of amplifier 10. The amplifier 28 is provided appropriate feedback and input resistances $R_2$ for inverting the voltage input thereto at essentially a unity ratio. Thus, amplifier 28 inverts the output voltage $V_o$ of amplifier. It should be recognized that the input and output resistors to amplifier 28 may be given different values, however, in order to provide a non-unity gain and to compensate for any non-unity gain characteristics of amplifier 10.

As shown in the drawing figure, the output of amplifier 28 is connected to the drain of transistor 23, via a resistor $R_3$. Operation of the inventive improved circuit may be understood from the following.

The output of filter 26 is represented by $V_o$, found at both the output and input of amplifier 10 which substantially acts as a unity gain buffer. The voltage $V_o$ is also the input to amplifier 28, which provides an output voltage $-V$ to resistor $R_3$. When transistor 23 is activated, or turned on, a current through resistor $R_1$ of filter 26, shown at $I_1$, flows to the drain of transistor 23. The magnitude of the current is easily determined to be $$I_1 = V_0/R_1.$$

In accordance with the invention, this current is caused to be matched exactly by the current $I_2$, flowing through the resistor $R_3$ connected to the output voltage $-V_o$ of amplifier 28. Since the magnitude of $I_2$ is given by $$I_2 = V_0/R_3,$$

the currents may be made to match by setting $R_3$ equal to $R_1$. Of course, if necessary, some modifications may be made to the equality requirement in order to offset any remaining current or circuit differences. For example, resistor $R_3$ may be made somewhat smaller than $R_1$ by a value equal to the ON resistance of transistor 27, in order to provide a combined resistance equal to $R_1$ between the output of amplifier 28 and the voltage Vx. Alternatively, by providing at the output of amplifier 28 an output voltage having a larger magnitude than the output of amplifier 21, any voltage drop across the ON switching transistor 27 may be compensated.

Accordingly, when transistor 23 (or transistors 23 and 27) is turned on by the control voltage 20, all current flowing thereto from the input node of amplifier 10 is matched by the current flowing out therefrom to the output terminal of amplifier 28. Thus, no current flows therethrough. Since no current flows through transistor 23, no voltage exists thereacross. Moreover, any effect of the ON resistance of transistor 23 has been completely eliminated.

Inasmuch as the above described embodiment of the invention provides matched resistance between the shunt and series switches of the arrangement 12, nonlinearity due to mismatches therebetween are effectively eliminated thereby.

It is seen that, generally viewed, the preferred embodiment of the present invention withdraws from switching transistor 23 all current provided thereto from the input terminal of amplifier 10. This operation is achieved by providing a feedback amplifier 28 generating an output voltage which is a predetermined function of the output voltage of the amplifier 10. Preferably, the output voltage of amplifier 28 is the negative of the output voltage of amplifier 10, although other functions may be used, depending on the particular application in which the invention is used.

An impedance, in the form of resistor $R_3$, is selected for controlling a current provided to the feedback amplifier 28. The current provided to amplifier 28 is selected to equal the current supplied to switching transistor 23. By selecting the impedance $R_3$ to equal the ratio of the voltage difference between the output of amplifier 28 and the voltage at transistor 23, on the one hand, and the current supplied to transistor 23 from amplifier 10, on the other hand, all such supplied current is withdrawn from transistor 23.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilized the invention in various embodiments and with various modifications as are suited to the particular use contemplated therefor. It is intended that the scope of the invention be defined by the claims appended hereto, when interpreted in accordance with full breath to which they are legally and equitably entitled.

We claim:

1. In a digital to analog converting apparatus having an input amplifier receiving a modulated signal comprised of different voltages provided through at least two switching devices and switchedly connected to the input amplifier, the improvement comprising:

linearity compensating circuit means for compensating for differences in resistance between said at least two switching devices, said linearity compensating circuit means including first means for substantially eliminating resistance of one of said switching devices from affecting a first voltage provided therethrough to said input amplifier, and second means for substantially eliminating resistance of another of said switching devices from affecting a second voltage provided therethrough to said input amplifier.

2. An improved apparatus as recited in claim 1 wherein said first means comprises voltage source means including a controlled amplifier means for maintaining a voltage provided by said voltage source means at a substantially constant value at an input to said input amplifier, and said second means includes feedback means for feeding back an output voltage of said input amplifier, said feedback means arranged for collecting substantially all current associated with said second voltage provided to said input amplifier thereby removing current from said another of said switching devices and eliminating effects of any resistance thereof on said second voltage provided to said input amplifier.

3. An improved apparatus as recited in claim 1 wherein said second means includes feedback means for feeding back an output voltage of said input amplifier, said feedback means arranged for collecting from said another of said switching devices all current associated with said second voltage provided to said input amplifier thereby removing current from said another of said switching devices and eliminating effects of any resistance thereof on said second voltage provided to said input amplifier, and wherein said feedback means comprises feedback amplifier means having an input and an output, said input of said feedback amplifier means connected to receive an output voltage of said input amplifier, said feedback amplifier means providing an output voltage equal to a predetermined multiple of said output voltage of said input amplifier, and further comprising means for setting a current withdrawn from said another of said switching devices to equal a current supplied thereto from said input terminal of said input amplifier.

4. In a digital to analog converter having an input amplifier receiving a pulse width modulated signal and first and second controlled switching devices for transmitting first and second voltages to an input of said input amplifier in a modulated manner, said first and second controlled switching devices connected to said input of said input amplifier, wherein said first controlled switching device is connected to a first voltage level and said second controlled switching device is connected to a second voltage level, the improvement comprising:

resistance eliminating means for eliminating resistance of at least one of said switching devices from affecting an output voltage produced by said input amplifier, said resistance eliminating means including withdrawing means for withdrawing from said at least one switching device an amount of current substantially equal to the current provided to said at least one switching device from said input of said input amplifier, said withdrawing means including:

amplifier means connected between an output of said input amplifier and said at least one switching device, gain control means for controlling gain of said amplifier means thereby to provide an output voltage of said amplifier means as a predetermined function of an output voltage at said output of said input amplifier, current control means for providing a current value as a predetermined function of said output voltage of said amplifier means, said current control means connected to obtain said current value from said at least one switching device, whereby all current provided to said at least one switching device from said input terminal of said input amplifier is withdrawn by said withdrawing means.

thereby substantially eliminating any effects of internal resistance of said at least one switching device from affecting output voltage or current of said input amplifier.

5. An improved digital to analog converter as recited in claim 4 wherein said current control means comprises impedance means selected as a ratio of said output voltage of said amplifier means to said current provided to said at least one switching device from said input terminal of said input amplifier.

6. An improved digital to analog converter as recited in claim 5 wherein said gain control means comprises resistance network means connected to input and output terminals of said amplifier means.

7. An improved digital to analog converter as recited in claim 4 wherein said gain control means comprises resistance network means connected to input and output terminals of said amplifier means.

8. A digital to analog converter including:
an input amplifier connected for receiving a digitally modulated signal and for converting said digitally modulated signal to an analog signal representing a value associated therewith, at least first and second controlled switching devices for respectively transmitting first and second voltages to an input of said input amplifier in a modulated manner, said first and second controlled switching devices connected to said input of said input amplifier, said first controlled switching device connected to a first voltage level and said second controlled switching device connected to a second voltage level, correction means for eliminating effects of resistance mismatch between said first and second controlled switching devices from an output voltage produced by said input amplifier, said correction means including withdrawing means for withdrawing from at least one of said switching devices an amount of current substantially equal to the current provided to said at least one switching device from said input of said input amplifier when said at least one switching device is ON, said withdrawing means including:
amplifier means connected between an output of said input amplifier and said at least one switching device, gain control means for controlling gain of said amplifier means thereby to provide an output voltage of said amplifier means as a predetermined function of an output voltage at said output of said input amplifier, current control means for providing a current value as a predetermined function of said output voltage of said amplifier means, said current control means connected to obtain said current value from said at least one switching device, whereby all current provided to said at least one switching device from said input terminal of said input amplifier is withdrawn by said withdrawing means, thereby substantially eliminating any effects of internal impedance of said at least one switching device from affecting output voltage or current of said input amplifier.

9. A digital to analog converter as recited in claim 8 wherein said correction means further comprises means for eliminating impedance effects of the second of said controlled switching devices from affecting output voltage or current of said input amplifier.

10. A digital to analog converter as recited in claim 8 wherein said first and second controlled switching devices comprise FET switching transistors driven by a control voltage applied to gate terminals thereof, including series and shunt connected switching transistor connected in series and in shunt with said input of said input amplifier.

11. A digital to analog converter as recited in claim 10 wherein said input amplifier comprises a non-inverting amplifier.

12. A digital to analog converter as recited in claim 11 further comprising filter means connected at said input to said input amplifier.

13. A digital to analog converter as recited in claim 10 further comprising filter means connected at said input to said input amplifier.

14. A digital to analog converter as recited in claim 8 wherein said input amplifier comprises a non-inverting amplifier.

15. A digital to analog converter as recited in claim 14 further comprising filter means connected at said input to said input amplifier.

16. A digital to analog converter as recited in claim 8 further comprising filter means connected at said input to said input amplifier.

* * * * *